(12) United States Patent
Hong et al.

(10) Patent No.: US 11,520,201 B2
(45) Date of Patent: Dec. 6, 2022

(54) DISPLAY APPARATUS COMPRISING THIN FILM TRANSISTOR AND METHOD FOR MANUFACTURING THE SAME

(71) Applicant: LG Display Co., Ltd., Seoul (KR)

(72) Inventors: Yewon Hong, Paju-si (KR); JungHyun Lee, Paju-si (KR); Hyun Soo Shin, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/111,267

(22) Filed: Dec. 3, 2020

(65) Prior Publication Data
US 2021/0181590 A1  Jun. 17, 2021

(30) Foreign Application Priority Data

Dec. 12, 2019 (KR) .......................... 10-2019-0165362

(51) Int. Cl.
*G02F 1/1362* (2006.01)
*H01L 27/12* (2006.01)

(52) U.S. Cl.
CPC .. *G02F 1/136286* (2013.01); *G02F 1/136209* (2013.01); *G02F 1/136277* (2013.01); *H01L 27/124* (2013.01)

(58) Field of Classification Search
CPC ............................................... G02F 1/136286
See application file for complete search history.

(56) References Cited

U.S. PATENT DOCUMENTS

| 2008/0128719 | A1  | 6/2008  | Cheng |                      |
|--------------|-----|---------|-------|----------------------|
| 2010/0230682 | A1* | 9/2010  | Song  | H01L 27/1248 438/34  |
| 2013/0264575 | A1* | 10/2013 | Liu   | H01L 27/1248 257/59  |
| 2014/0042429 | A1* | 2/2014  | Park  | H01L 27/1262 257/288 |

(Continued)

FOREIGN PATENT DOCUMENTS

| KR | 10-2013-0011794 A | 1/2013 |
| KR | 10-2013-0078381 A | 7/2013 |
| KR | 10-2017-0080047 A | 7/2017 |

OTHER PUBLICATIONS

German Patent Office, Office Action, DE Patent Application No. 10 2020 132 168.6, dated Oct. 19, 2022, nine pages.

*Primary Examiner* — Sang V Nguyen
(74) *Attorney, Agent, or Firm* — Fenwick & West LLP

(57) ABSTRACT

Disclosed is a display apparatus and a method for manufacturing the same, wherein the display apparatus comprises a substrate, a light shielding layer, a signal line and a first electrode on the substrate, an active layer, a gate electrode, a second electrode, a first connection electrode for connecting the active layer with the signal line, and a second connection electrode for connecting the active layer with any one of the first electrode and the second electrode, wherein any one of the first electrode and the second electrode is a pixel electrode of a display device, and the other is a common electrode of the display device, the light shielding layer, the signal line and the first electrode are disposed on the same layer, and the first connection electrode and the second connection electrode are formed of the same material as that of the second electrode.

23 Claims, 9 Drawing Sheets

(56) References Cited

U.S. PATENT DOCUMENTS

| | | | |
|---|---|---|---|
| 2014/0218654 A1* | 8/2014 | Ochiai | G02F 1/1368 349/46 |
| 2015/0311232 A1* | 10/2015 | Sun | H01L 27/1222 257/72 |
| 2017/0090229 A1* | 3/2017 | Imai | H01L 29/78633 |
| 2017/0162605 A1* | 6/2017 | Yamamoto | G09G 3/3648 |
| 2018/0356701 A1 | 12/2018 | Hyodo et al. | |
| 2020/0371401 A1* | 11/2020 | Kitagawa | H01L 27/1251 |
| 2021/0036158 A1* | 2/2021 | Nishimiya | H01L 21/02483 |
| 2021/0043656 A1* | 2/2021 | Hara | G02F 1/136227 |

* cited by examiner

DISPLAY APPARATUS COMPRISING THIN FILM TRANSISTOR AND METHOD FOR MANUFACTURING THE SAME

CROSS-REFERENCE TO RELATED APPLICATIONS

This application claims the benefit of Republic of Korea Patent Application No. 10-2019-0165362 filed on Dec. 12, 2019, which is hereby incorporated by reference as if fully set forth herein.

BACKGROUND

Field

The present disclosure relates to a display apparatus comprising a thin film transistor and a method for manufacturing the same. In more detail, the present disclosure relates to a display apparatus capable of simplifying a structure and a manufacturing process, and a method for manufacturing the same.

Discussion of the Related Art

A display apparatus which displays various information on a screen is a technology-intensive device in which core technologies of an information communication field are integrated. Recently, the display apparatus has been developed so as to realize thin profile, lightness, portability, and furthermore, high performance. Typical examples of the display apparatus may be a liquid crystal display (LCD) device and an organic light emitting diode display (OLED) device.

Generally, a mask process using a photo mask is carried out several times so as to manufacture the display apparatus. Each mask process requires cleaning, exposure, developing and etching steps or the like. Accordingly, whenever one mask process is added, it may cause the increase of manufacturing time and cost, and furthermore, it may cause the increase of possibility of defect and defect rate. As a result, a manufacturing yield is lowered. Thus, in order to lower a manufacturing cost, and to improve a production yield and efficiency, it is necessary to simplify a structure and a manufacturing process.

SUMMARY

The present disclosure has been made in view of the above problems, and it is an object of the present disclosure to provide a display apparatus capable of simplifying a structure and a manufacturing process, and a method for manufacturing the same.

It is another object of the present disclosure to provide a method for manufacturing a display apparatus capable of simplifying a manufacturing process by forming a signal line, a light shielding layer, and a first electrode of a display device at the same time. Also, it is another object of the present disclosure to provide a method for manufacturing a display apparatus capable of simplifying a manufacturing process by omitting a process for forming source and drain electrodes for a thin film transistor.

It is a further object of the present disclosure to provide a display apparatus manufactured by the above manufacturing method.

In accordance with an aspect of the present disclosure, the above and other objects can be accomplished by the provision of a display apparatus comprising a substrate, a light shielding layer, a signal line and a first electrode on the substrate, an active layer on the light shielding layer, the signal line and the first electrode, a gate electrode on the active layer and the gate electrode being partially overlapped with the active layer, a second electrode on the gate electrode, a first connection electrode configured to connect the active layer with the signal line, and a second connection electrode configured to connect the active layer with any one of the first electrode and the second electrode, wherein any one of the first electrode and the second electrode is a pixel electrode of a display device, and the other is a common electrode, the light shielding layer, the signal line and the first electrode are disposed on the same layer, and the first connection electrode and the second connection electrode are formed of the same material as that of the second electrode.

The signal line may include a first conductive layer formed of the same material as that of the first electrode, and a second conductive layer on the first conductive layer, wherein a resistivity of the second conductive layer may be lower than a resistivity of the first conductive layer.

The first conductive layer may be formed of a transparent conductive oxide (TCO), and the second conductive layer may be formed of metal or metal alloy.

The signal line may be a data line.

The light shielding layer may have a lamination structure which is the same as that of the signal line.

The light shielding layer may be connected with the gate electrode.

The display apparatus may further comprise a gate insulating film disposed between the active layer and the gate electrode, and provided on an entire upper surface of the substrate including an upper surface of the active layer.

The active layer may be disposed between the gate electrode and the substrate.

The active layer may include an oxide semiconductor material.

The active layer may include a first oxide semiconductor layer on a buffer layer, and a second oxide semiconductor layer on the first oxide semiconductor layer.

The active layer may have a tapered shape.

The first connection electrode and the second connection electrode may be disposed on the same layer as that of the second electrode.

The display apparatus may further comprise a liquid crystal layer disposed on the second electrode.

In accordance with another aspect of the present disclosure, there is provided a method for manufacturing a display apparatus comprising forming a first conductive material layer of a transparent conductive oxide (TCO) on a substrate, and forming a second conductive material layer on the first conductive material layer, wherein a resistivity of the second conductive material layer is lower than a resistivity of the first conductive material layer, forming a light shielding layer, a signal line and a first electrode by patterning the first conductive material layer and the second conductive material layer by the use of etching process using a halftone mask, forming an active layer on the light shielding layer, the signal line and the first electrode, forming a gate electrode on the active layer and the gate electrode being partially overlapped with the active layer, selectively providing conductivity to the active layer to selectively make conducting regions in the active layer under the condition that the gate electrode is used as a mask, and forming a first connection electrode configured to connect the active layer with the signal line, and forming a second connection electrode configured to connect the active layer with any one of the first electrode and the second electrode, wherein any one of the first electrode and the second electrode is a pixel electrode of a display device, and the other is a common electrode of the display device.

The first connection electrode, the second connection electrode and the second electrode may be manufactured by the same process using the same material.

The signal line may include a first conductive layer formed by patterning the first conductive material layer, and a second conductive layer formed by patterning the second conductive material layer.

The light shielding layer may have a lamination structure which is the same as that of the signal line.

The second conductive material layer on the first conductive material layer may be removed in the forming of the first electrode.

The step of selectively making the conducting regions in the active layer may be performed by a doping process.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION OF THE DISCLOSURE

Figure 1:
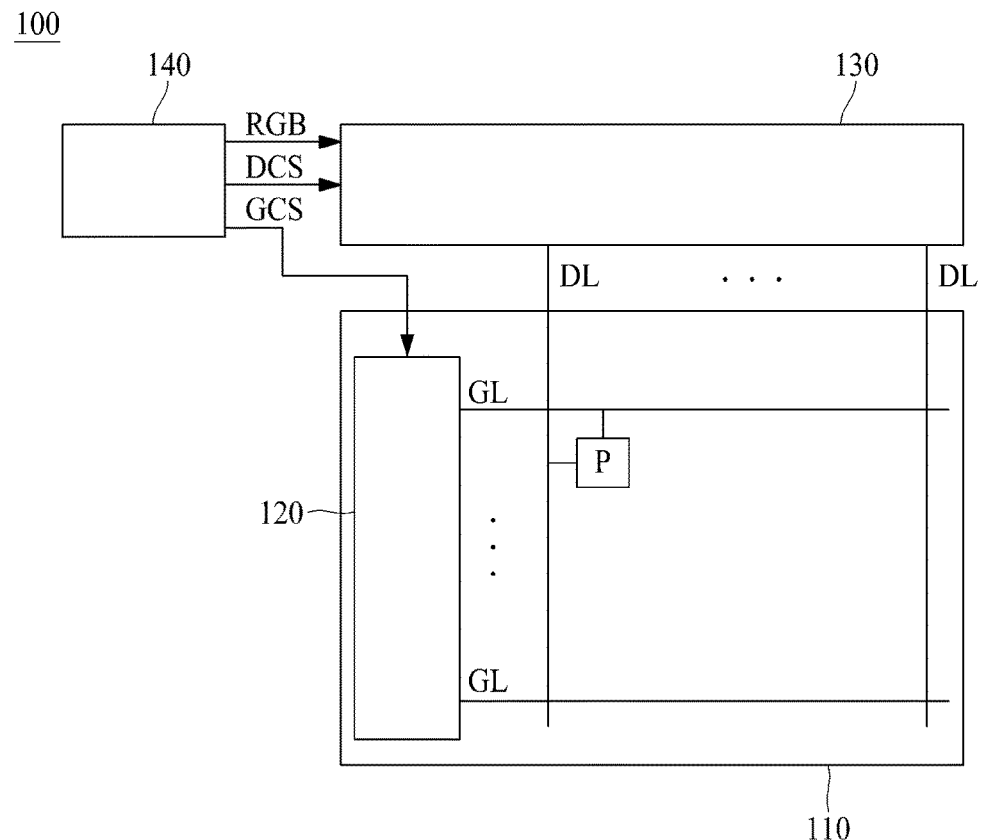
FIG. 1 is a schematic view illustrating a display apparatus according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error range although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display apparatus 100 according to one embodiment of the present disclosure.

As shown in FIG. 1, the display apparatus 100 according to one embodiment of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL). The pixel (P) includes a display device, and a pixel driver (PDC) configured to drive the display device. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system (not shown). Also, the controller 140 samples input video data, which is provided from the external system, and then re-aligns the sampled video data, and supplies the re-aligned digital video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into a data voltage, and supplies the data voltage to the data lines (DL).

The gate driver 120 sequentially supplies a gate pulse (GP) to the gate lines (GL) for 1 frame period. Herein, '1 frame' indicates the period in which one image is output through the use of display panel 110. Also, the gate driver 120 supplies a gate-off signal for turning off a switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one embodiment of the present disclosure, the gate driver 120 may be provided on the display panel 110. A structure of directly providing the gate driver 120 on the display panel 110 may be referred to as Gate-In-Panel (GIP) structure.

Figure 2:
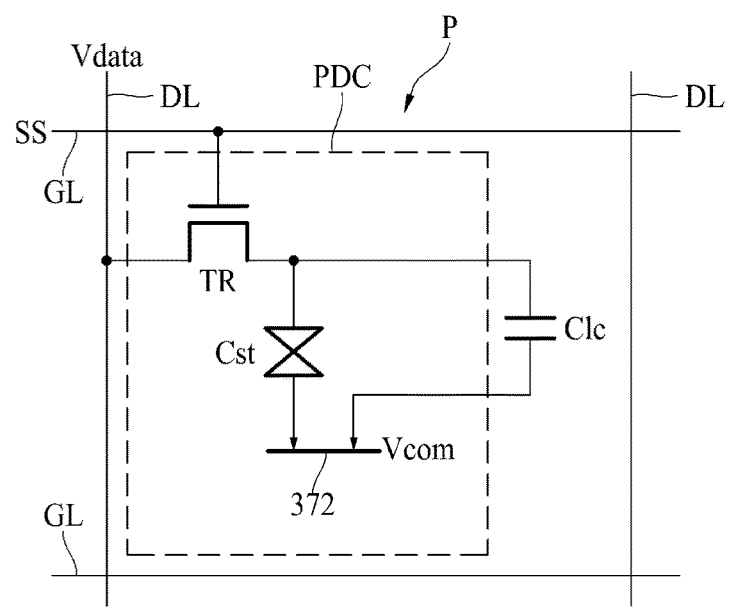
FIG. 2 is a circuit diagram for any one pixel of FIG. 1 according to one embodiment of the present disclosure.
Figure 3:
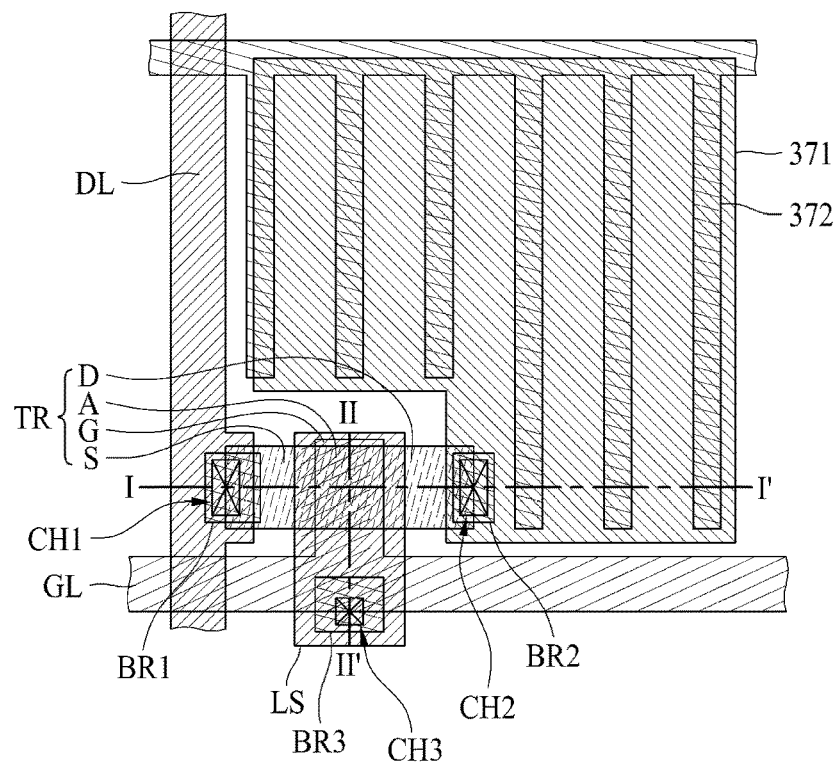
FIG. 3 is a plan view illustrating the pixel of FIG. 2 according to one embodiment of the present disclosure.
Figure 4:
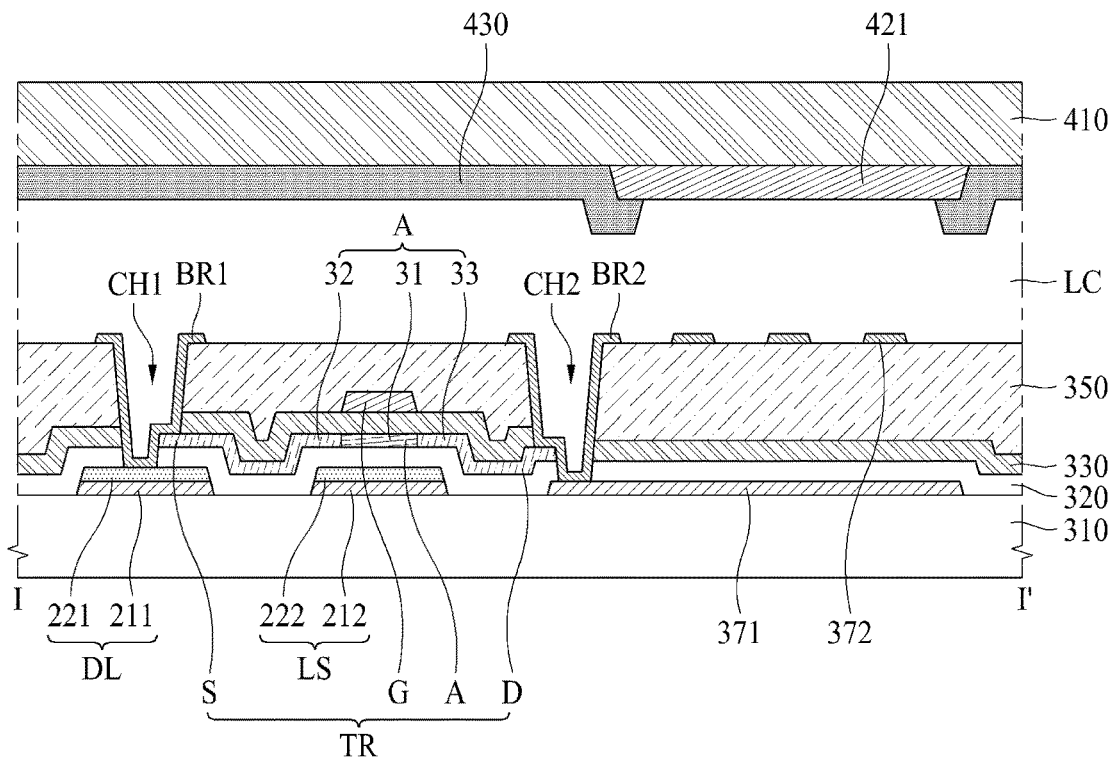
FIG. 4 is a cross sectional view along I-I' of FIG. 3 according to one embodiment of the present disclosure.

FIG. 2 is a circuit diagram illustrating any one pixel (P) of FIG. 1 according to one embodiment of the present disclosure, FIG. 3 is a plan view illustrating the pixel (P) of FIG. 2 according to one embodiment of the present disclosure, and FIG. 4 is a cross sectional view along I-I' of FIG. 3 according to one embodiment of the present disclosure.

The circuit diagram of FIG. 2 is an equivalent circuit diagram for a pixel (P) of a liquid crystal display apparatus including liquid crystal (LC).

Referring to FIGS. 2, 3, and 4, the display apparatus 100 according to one embodiment of the present disclosure includes a substrate 310, a pixel driver (PDC) on the substrate 310, and a liquid crystal capacitor (Clc) connected with the pixel driver (PDC). Herein, the liquid crystal capacitor (Clc) corresponds to a display device.

In detail, as shown in FIG. 2, the pixel (P) of the liquid crystal display apparatus may include the pixel driver (PDC), and the liquid crystal capacitor (Clc) corresponding to the display device. Referring to FIGS. 3 and 4, the display device of the display apparatus 100 according to one embodiment of the present disclosure may include a first electrode 371, a second electrode 372, and a liquid crystal layer (LC).

The pixel driver (PDC) includes a thin film transistor (TR) connected with a gate line (GL) and a data line (DL), and a storage capacitor (Cst) connected between the thin film transistor (TR) and the second electrode 372 of the display device. The liquid crystal capacitor (Clc) is connected with a storage capacitor (Cst) in parallel between the thin film transistor (TR) and the second electrode 372.

The liquid crystal capacitor (Clc) corresponding to the display device is charged with a difference voltage between a data signal supplied to the first electrode 371 through the thin film transistor (TR) and a common voltage (Vcom) supplied to the second electrode 372, and controls an amount of light transmittance by driving liquid crystal in accordance with the charged voltage. The storage capacitor (Cst) stably maintains the voltage charged in the liquid crystal capacitor (Clc).

Referring to FIG. 4, the display apparatus 100 according to one embodiment of the present disclosure includes a light shielding layer (LS), the data line (DL) and the first electrode 371 provided on the substrate 310, an active layer (A), a gate electrode (G), the second electrode 372, a first connection electrode (BR1), and a second connection electrode (BR2).

The substrate 310 may be formed of glass or plastic. The substrate 310 may be formed of plastic having flexibility, for example, polyimide (PI).

In FIGS. 3 and 4, the data line (DL) is shown as a signal line. Hereinafter, for convenience of explanation, the embodiments of the present disclosure show the data line (DL) which serves as the signal line.

Referring to FIG. 4, the light shielding layer (LS), the data line (DL) corresponding to the signal line, and the first electrode 371 are provided on the substrate 310. The light shielding layer (LS), the data line (DL), and the first electrode 371 are disposed on the same layer. The light shielding layer (LS), the data line (DL), and the first electrode 371 may be manufactured together by one mask process.

The data line (DL) provides a data voltage (Vdata) to the pixel driver (PDC), and the thin film transistor (TR) controls applying of the data voltage (Vdata).

The data line (DL) includes a first conductive layer 211, and a second conductive layer 221 on the first conductive layer 211.

The first conductive layer 211 may be formed of the same material as that of the first electrode 371. According to one embodiment of the present disclosure, the first conductive layer 211 includes a transparent conductive oxide (TCO). For example, the transparent conductive oxide (TCO) may be ITO(InSnO), IZO(InZnO), IZTO(InZnSnO), ZO(ZnO), and etc. According to one embodiment of the present disclosure, the first conductive layer 211 may be formed of ITO which is one of the transparent conductive oxide (TCO).

A resistivity of the second conductive layer 221 is lower than a resistivity of the first conductive layer 211. Thus, the second conductive layer 221 has an electrical conductivity which is greater than that of the first conductive layer 211.

The second conductive layer 221 may be formed of metal or metal alloy. For example, the second conductive layer 221 may include at least one among molybdenum (Mo), aluminum (Al), chrome (Cr), aurum (Au), titanium (Ti), nickel (Ni), neodymium (Nd), copper (Cu), and their alloys. The second conductive layer 221 may be formed in a single-layered structure comprising the above metal or metal alloys, or may be formed in a multi-layered structure comprising at least two of the above metal or metal alloys.

The light shielding layer (LS) prevents externally-provided incident light. The light shielding layer (LS) includes a material capable of preventing light, for example, metal material so that it is possible to protect the active layer (A) from externally-provided incident light.

According to one embodiment of the present disclosure, the light shielding layer (LS) has a lamination structure which is identical to that of the data line (DL). The light shielding layer (LS) and the data line (DL) corresponding to the signal line may be manufactured by the same process using the same material.

In detail, the light shielding layer (LS) includes a first conductive layer 212, and a second conductive layer 222 on the first conductive layer 212. A composition of the first conductive layer 212 of the light shielding layer (LS) may be the same as a composition of the first conductive layer 211 of the data line (DL). A composition of the second conductive layer 222 of the light shielding layer (LS) may be the same as a composition of the second conductive layer 221 of the data line (DL).

The first electrode 371 may be formed of the same material as that of the first conductive layer 211 of the data line (DL). Also, the first electrode 371 may be formed of the same material as that of the first conductive layer 212 of the light shielding layer (LS).

According to one embodiment of the present disclosure, the first electrode 371 includes a transparent conductive oxide (TCO). For example, the transparent conductive oxide (TCO) may be ITO(InSnO), IZO(InZnO), IZTO(InZnSnO), ZO(ZnO), and etc. According to one embodiment of the present disclosure, the first electrode 371 may be formed of ITO.

The second conductive layer is not disposed on the first electrode 371 of the transparent conductive oxide (TCO), unlike the data line (DL) and the light shielding layer (LS).

The first electrode 371 may be a pixel electrode or common electrode of the display device included in the liquid crystal display apparatus. The first electrode 371 shown in FIGS. 3 and 4 serves as the pixel electrode.

A buffer layer 320 is disposed on the light shielding layer (LS), the data line (DL), and the first electrode 371. The buffer layer 320 is formed of an insulating material, and the buffer layer 320 protects the active layer (A) from externally-provided moisture or oxygen. The buffer layer 320 may be formed of an insulating material, for example, silicon oxide or silicon nitride.

The active layer (A) of the thin film transistor (TRlc) is disposed on the buffer layer 320. At least some portions of the active layer (A) of the thin film transistor (TR) may be overlapped with the light shielding layer (LS).

According to one embodiment of the present disclosure, the active layer (A) may include an oxide semiconductor material. For example, the active layer (A) may include at least one among IZO(InZnO)-based oxide semiconductor material, IGO(InGaO)-based oxide semiconductor material, GO(GaO)-based oxide semiconductor material, ITO(InSnO)-based oxide semiconductor material r, IGZO(InGaZnO)-based oxide semiconductor material, IGTO(InGaSnO)-based oxide semiconductor material, IGZTO (InGaZnSnO)-based oxide semiconductor material, GZTO (GaZnSnO)-based oxide semiconductor material, GZO (GaZnO)-based oxide semiconductor material, and ITZO (InSnZnO)-based oxide semiconductor material. However, one embodiment of the present disclosure is not limited to the above materials. The active layer (A) may be formed of other oxide semiconductor materials generally known to those in the art.

Referring to FIG. 4, a gate insulating film 330 is disposed on the active layer (A). The gate insulating film 330 has the insulating properties. The gate insulating film 330 may be patterned together with the gate electrode (G), or not.

According to one embodiment of the present disclosure, as shown in FIG. 4, the gate insulating film 330 may be disposed on an entire upper surface of the substrate 310 including an upper surface of the active layer (A). In this case, the gate insulating film 330 is not patterned.

The gate electrode (G) is disposed on the gate insulating film 330. The gate insulating film 330 is disposed between the active layer (A) and the gate electrode (G), whereby the active layer (A) and the gate electrode (G) are insulated from each other.

The gate electrode (G) may be the region extended from the gate line (GL), or may be some regions of the gate line (GL). The gate electrode (G) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate electrode (G) may have a multi-layered structure including at least two layers with the different physical properties.

By a step of selectively providing conductivity to the active layer using the gate electrode (G) as a mask, some regions of the active layer (A) become conducting regions.

A region of the active layer (A), which is overlapped with the gate electrode (G), is not provided with conductivity, and thus does not become the conducting region, but become a channel region 31. Some regions of the active layer (A), which are not overlapped with the gate electrode (G), are provided with conductivity, and thus become the conducting regions 32 and 33. The conducting regions 32 and 33 may be formed at both sides with respect to the channel region 31.

According to one embodiment of the present disclosure, some regions of the active layer (A) may be provided with conductivity and thus become the conducting regions by a doping process using dopant. In this case, doped regions become the conducting regions, and some regions of the active layer (A) may be doped with the dopant through the gate insulating film 330. Thus, even though the active layer (A) is not exposed from the gate insulating film 330, a selective doping for the active layer (A) is possible. Thus, according to another embodiment of the present disclosure, it is possible not to pattern the gate insulating film 330.

Any one of the conducting regions 32 and 33 becomes a source region 32, and the other becomes a drain region 33.

The source region 32 serves as a source connection region connected with the source electrode (S), or the source region 32 itself serves as the source electrode (S). The drain region 33 serves as a drain connection region connected with the drain electrode (D), or the drain region 33 itself serves as the drain electrode (D).

The source region 32 and the drain region 33 shown in FIG. 4 are distinguished from each other, for convenience of explanation. However, the source region 32 and the drain region 33 may be used interchangeably. According to a voltage, the source region 32 may become the drain region 33, and the drain region 33 may become the source region 32. Also, the source region 32 may become the source electrode (S) or the drain electrode (D), and the drain region 33 may become the drain electrode (D) or the source electrode (S).

In FIG. 4, the source region 32 is referred to as the source electrode (S), and the drain region 33 is referred to as the drain electrode (D).

According to one embodiment of the present disclosure, the gate electrode (G) may be connected with the light shielding layer (LS).

Although not shown, a passivation layer (not shown) may be disposed on the gate electrode (G). The passivation layer may protect the active layer (A) and the gate electrode (G).

According to one embodiment of the present disclosure, additional source and drain electrodes are not provided. Thus, according to one embodiment of the present disclosure, it is possible to omit a patterning process for forming the source electrode and the drain electrode. As a result, it is possible to simplify a manufacturing process of the display apparatus 100.

A protection layer 350 is disposed on the gate electrode (G). The protection layer 350 is provided to planarize an upper surface of the gate electrode (G), and to protect the pixel driver (PDC), whereby the protection layer 350 may be referred to as a planarization layer.

The second electrode 372 of the display device is disposed on the protection layer 350.

A common voltage is applied to the second electrode 372. Thus, the second electrode 372 may be referred to as a common electrode. The first electrode 371 and the second electrode 372 may be interchanged in position.

In the liquid crystal display apparatus, the liquid crystal capacitor (Clc) serves as the display device of the display apparatus 100. Any one of the first electrode 371 and the second electrode 372 may be the pixel electrode, and the other may be the common electrode.

In the display apparatus 100 shown in FIGS. 3 and 4, the first electrode 371 functions as the pixel electrode, and the second electrode 372 functions as the common electrode. According to one embodiment of the present disclosure, the display device includes the first electrode 371 corresponding to the pixel electrode, the second electrode 372 corresponding to the common electrode, and the liquid crystal layer (LC).

Referring to FIGS. 3 and 4, the first electrode 371 has a surface-shaped electrode type, and the second electrode 372 has a line-shaped electrode type, but not limited to these types. For instance, the first electrode 371 may have a line-shaped electrode type, and the second electrode 372 may have a surface-shaped electrode type. In another way, both the first and second electrodes 371 and 372 may have a line-shaped electrode type, or both the first and second electrodes 371 and 372 may have a surface-shaped electrode type.

Referring to FIG. 4, first and second connection electrodes (BR1, BR2) are disposed on the protection layer 350.

The first connection electrode (BR1) and the second connection electrode (BR2) are formed of the same material as that of the second electrode 372. The first connection electrode (BR1), the second connection electrode (BR2), and the second electrode 372 may be manufactured by the same process using the same material, and may be disposed on the same layer.

The first connection electrode (BR1) connects the active layer (A) with the data line (DL). The second connection electrode (BR2) connects the active layer (A) with the first electrode 371.

As shown in FIG. 4, a first contact hole (CHL1) may be provided in order to connect the data line (DL) and the active layer (A) with each other. The first contact hole (CH1) penetrates through the protection layer 350, the gate insulating film 330, and the buffer layer 320. The first connection electrode (BR1) is disposed on at least some portions of the sidewall and the bottom of the first contact hole (CH1), whereby the data line (DL) and the active layer (A) are connected with each other. In detail, referring to FIG. 4, the first connection electrode (BR1) is in contact with the data line (DL), and is also in contact with the source region 32 of the active layer (A). According to one embodiment of the present disclosure, the source region 32 of the active layer (A) serves as the source electrode (S). Thus, the first connection electrode (BR1) connects the data line (DL) with the source electrode (S) of the thin film transistor (TR).

Also, a second contact hole (CH2) may be provided to connect the first electrode 371 and the active layer (A) with each other. The second contact hole (CH2) penetrates through the protection layer 350, the gate insulating film 330, and the buffer layer 320. The second connection electrode (BR2) is disposed on at least some portions of the sidewall and the bottom of the second contact hole (CH2), whereby the first electrode 371 and the active layer (A) are connected with each other. In detail, referring to FIG. 4, the second connection electrode (BR2) is in contact with the first electrode 371, and is also in contact with the drain region 33 of the active layer (A). According to one embodiment of the present disclosure, the drain region 33 of the active layer (A) serves as the drain electrode (D). Thus, the second connection electrode (BR2) connects the first electrode 371 with the drain electrode (D) of the thin film transistor (TR).

The liquid crystal layer (LC) is disposed on the second electrode 372. In detail, the liquid crystal layer (LC) is disposed between the substrate 310 and its confronting substrate 410.

Referring to FIG. 4, a color filter 421 is disposed on the confronting substrate 410, and a black matrix 430 is disposed between each color filter 421. The black matrix 430 is provided to divide each pixel area.

In FIG. 4, the color filter 421 is disposed on the confronting substrate 410, but not limited to this structure. For instance, the color filer 421 may be disposed on the substrate 310.

According to one embodiment of the present disclosure, the thin film transistor (TR) is formed by the active layer (A) and the gate electrode (G). In the thin film transistor (TR), the source region 32 of the active layer (A) becomes the source electrode (S), and the drain region 33 becomes the drain electrode (D).

In the thin film transistor (TR) shown in FIG. 4, the active layer (A) is disposed between the gate electrode (G) and the substrate 310. As shown in FIG. 4, if the substrate 310 is the bottom, a structure of the thin film transistor where the gate electrode (G) is disposed above the active layer (A) is referred to as a top gate structure.

In contrast to the top gate structure, there is a bottom gate structure where the gate electrode (G) is disposed below the active layer (A).

In case of the thin film transistor of the bottom gate structure, a capacitance (Cap) is generated between the gate electrode and the source electrode or between the gate electrode and the drain electrode. Thus, in case of the bottom gate structure, a voltage of turning on the thin film transistor is relatively higher than that of the top gate structure. Thus, the bottom gate structure has a disadvantage of a relatively large power consumption.

Meanwhile, in case of the thin film transistor of the top gate structure, it has an advantage of a relatively small power consumption. However, in case of the thin film transistor of the top gate structure, it has disadvantages of a multi-layered structure for a manufacturing process, and a large size of the thin film transistor.

However, according to one embodiment of the present disclosure, the active layer (A) is in contact with the data line (DL) corresponding to the signal line by the use of first connection electrode (BR1) without forming additional source and drain electrodes. Thus, according to the present disclosure, it is possible to decrease the number of steps for forming the thin film transistors (TR), and also to decrease the number of deposited layers, whereby it is possible to lower a manufacturing cost. Also, even though the thin film transistor (TR) of the present disclosure has the top gate structure, the size of the thin film transistor is small, whereby the thin film transistor of the present disclosure may be usefully applied to a high resolution display apparatus.

Figure 5:
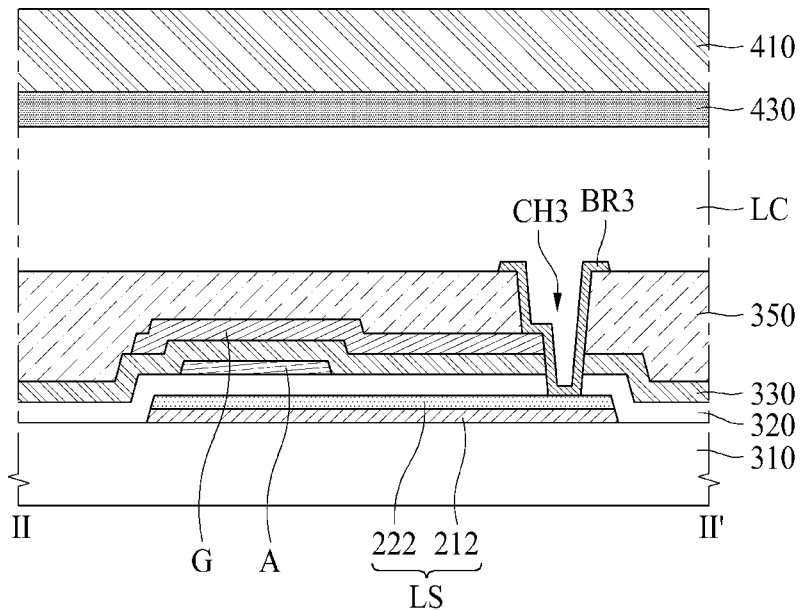
FIG. 5 is a cross sectional view along II-II' of FIG. 3 according to one embodiment of the present disclosure.

FIG. 5 is a cross sectional view along II-II' of FIG. 3 according to one embodiment of the present disclosure.

Referring to FIG. 5, the light shielding layer (LS) is connected with the gate electrode (G) by the use of third connection electrode (BR3). A third contact hole (CH3) is provided to connect the light shielding layer (LS) with the gate electrode (G).

According as the light shielding layer (LS) is connected with the gate electrode (G), it is possible to prevent the light shielding layer (L) from being left in an unstable floating state. Also, according as the light shielding layer (LS) is connected with the gate electrode (G), it may have an occurrence of effect that happens when the gate electrode is disposed at both sides of the active layer (A), whereby it is possible to increase an turning-on current of the thin film transistor (TR).

Figure 6:
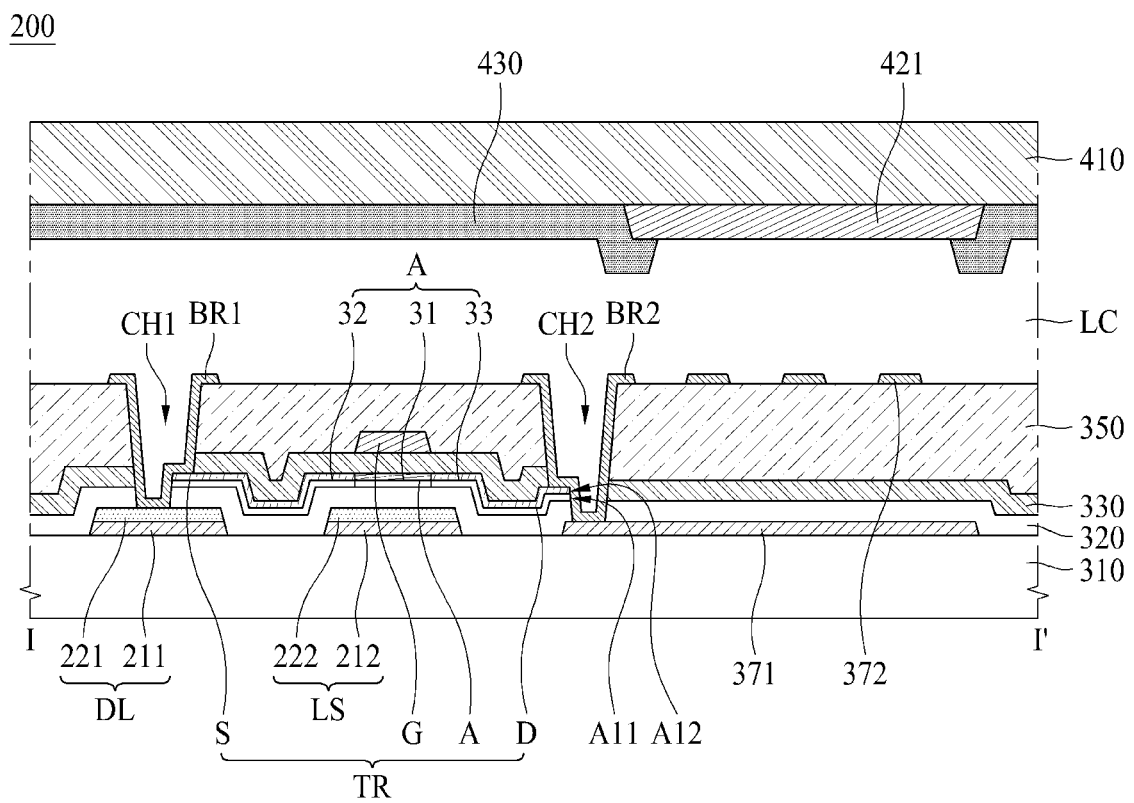
FIG. 6 is a cross sectional view illustrating a pixel of a display apparatus according to another embodiment of the present disclosure.

FIG. 6 is a cross sectional view illustrating a pixel of a display apparatus 200 according to another embodiment of the present disclosure.

In the display apparatus 200 shown in FIG. 6, an active layer (A) has a multi-layered structure. Referring to FIG. 6, the active layer (A) includes a first oxide semiconductor layer (A11) on a buffer layer 320, and a second oxide semiconductor layer (A12) on the first oxide semiconductor layer (A11).

According to one embodiment of the present disclosure, the first oxide semiconductor layer (A11) serves as a support layer configured to support the second oxide semiconductor layer (A12), and the second oxide semiconductor layer (A12) serves as a channel layer. Typically, a channel of the active layer (A) is provided in the second oxide semiconductor layer (A12).

For improvement of the film stability, the first oxide semiconductor layer (A11), which serves as the support layer, may include gallium (Ga), wherein gallium (Ga) forms a stabilized bond to oxygen, whereby the first oxide semiconductor layer (A11) has good film stability. According to one embodiment of the present disclosure, the first oxide semiconductor layer (A11) may include at least one among IGZO(InGaZnO)-based oxide semiconductor material, IGO(InGaO)-based oxide semiconductor material, IGTO(InGaSnO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material. However, one embodiment of the present disclosure is not limited to the above materials. The first oxide semiconductor layer (A11) may be formed of other oxide semiconductor materials generally known to those in the art.

The second oxide semiconductor layer (A12) may include at least one among IZO(InZnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO (GaZnSnO)-based oxide semiconductor material, GZO (GaZnO)-based oxide semiconductor material, and ITZO (InSnZnO)-based oxide semiconductor material. However, one embodiment of the present disclosure is not limited to the above materials. The second oxide semiconductor layer (A12) may be formed of other oxide semiconductor materials generally known to those in the art.

The second oxide semiconductor layer (A12) has the electrical properties which are greater than that of the first oxide semiconductor layer (A11), and the first oxide semiconductor layer (A11) has the greater film stability and greater tolerance to etching than that of the second oxide semiconductor layer (A21). By adjusting an etching ratio of the first oxide semiconductor layer (A11) and the second oxide semiconductor layer (A12), the active layer (A) may have a tapered shape. According to one embodiment of the present disclosure, the tapered shape may be provided in such a way that a width of a lower-sided layer is relatively larger than a width of an upper-sided layer, whereby it may have a structural stability. If the active layer (A) has the tapered shape, the active layer (A) may be in stable contact with the connection electrode (BR1, BR2). In more detail, if the active layer (A) has the tapered shape, the source region 32 may be in stable contact with the first connection electrode (BR1) at one end of the active layer (A), and the drain region 33 may be in stable contact with the second connection electrode (BR2) at the other end of the active layer (A).

Figure 7:
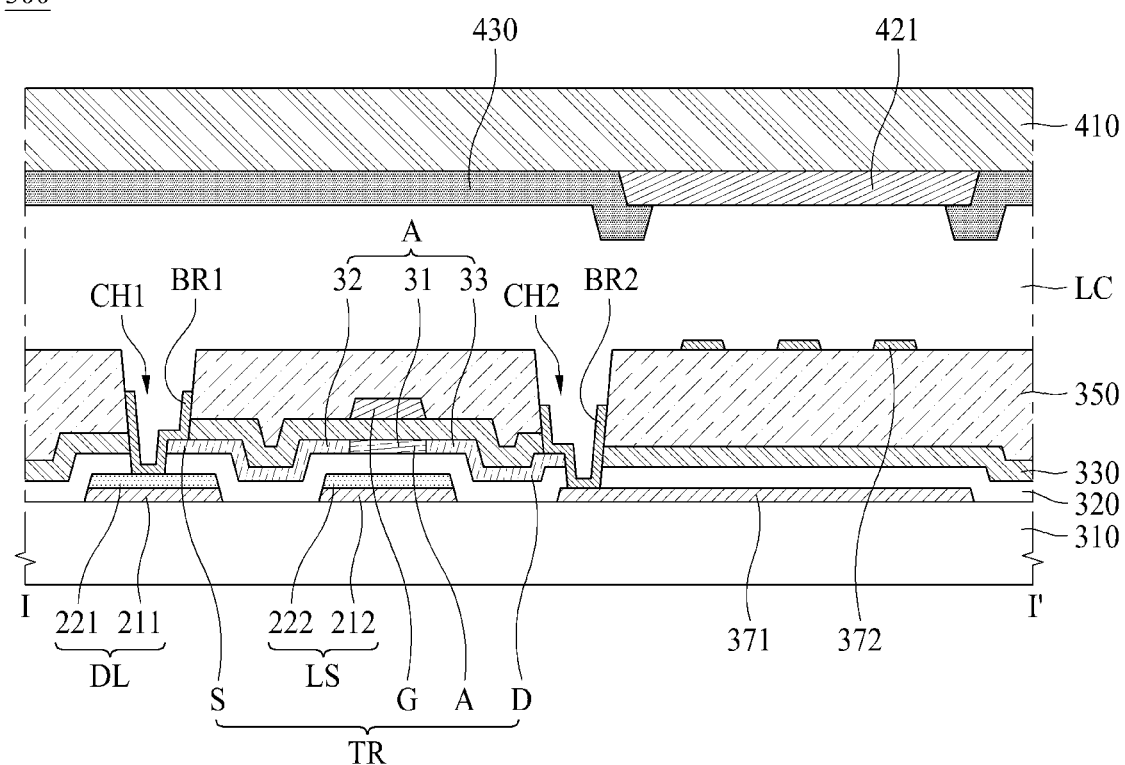
FIG. 7 is a cross sectional view illustrating a pixel of a display apparatus according to another embodiment of the present disclosure.

FIG. 7 is a cross sectional view illustrating a pixel of a display apparatus 300 according to another embodiment of the present disclosure.

In comparison to FIG. 4, a connection electrode (BR1, BR2) of FIG. 7 does not extend to an upper surface of a protection layer 350. A first connection electrode (BR1) connects a data line (DL) with an active layer (A), however, the first connection electrode (BR1) does not extend to the upper surface of the protection layer 350. Also, a second connection electrode (BR2) connects a first electrode 371 with the active layer (A), however, the second connection electrode (BR2) does not extend to the upper surface of the protection layer 350.

As shown in FIG. 7, the connection electrodes (BR1, BR2, BR3) may be formed in a minimum or reduced size which allows an electrical connection function. In this case, an occupying area of the connection electrode (BR1, BR2) is decreased so that it is possible to improve an aperture ratio of the display apparatus 300.

Figure 8:
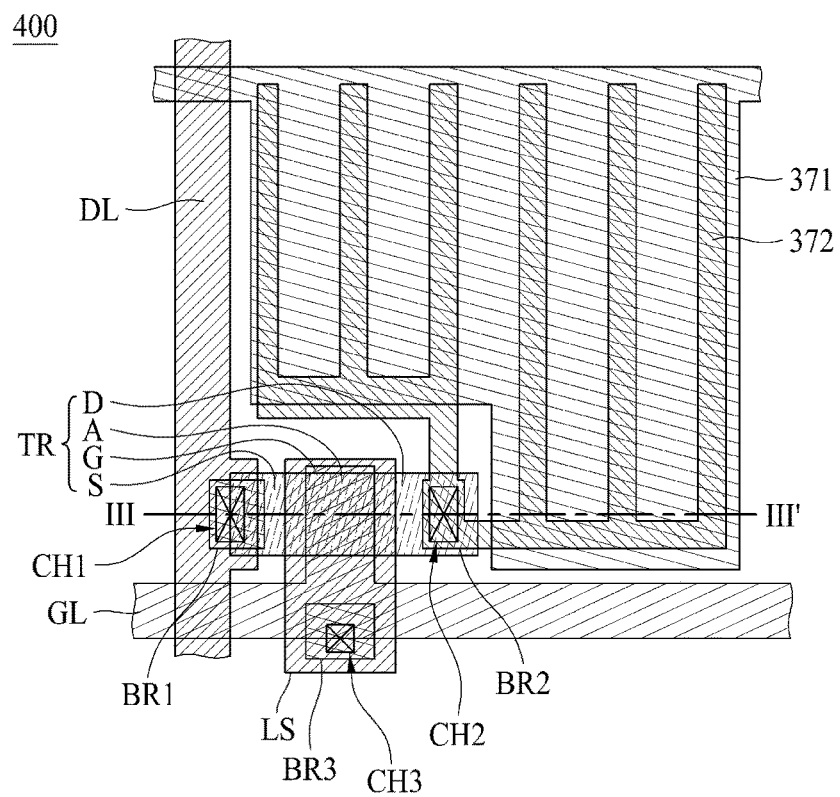
FIG. 8 is a plan view illustrating a pixel of a display apparatus according to another embodiment of the present disclosure.
Figure 9:
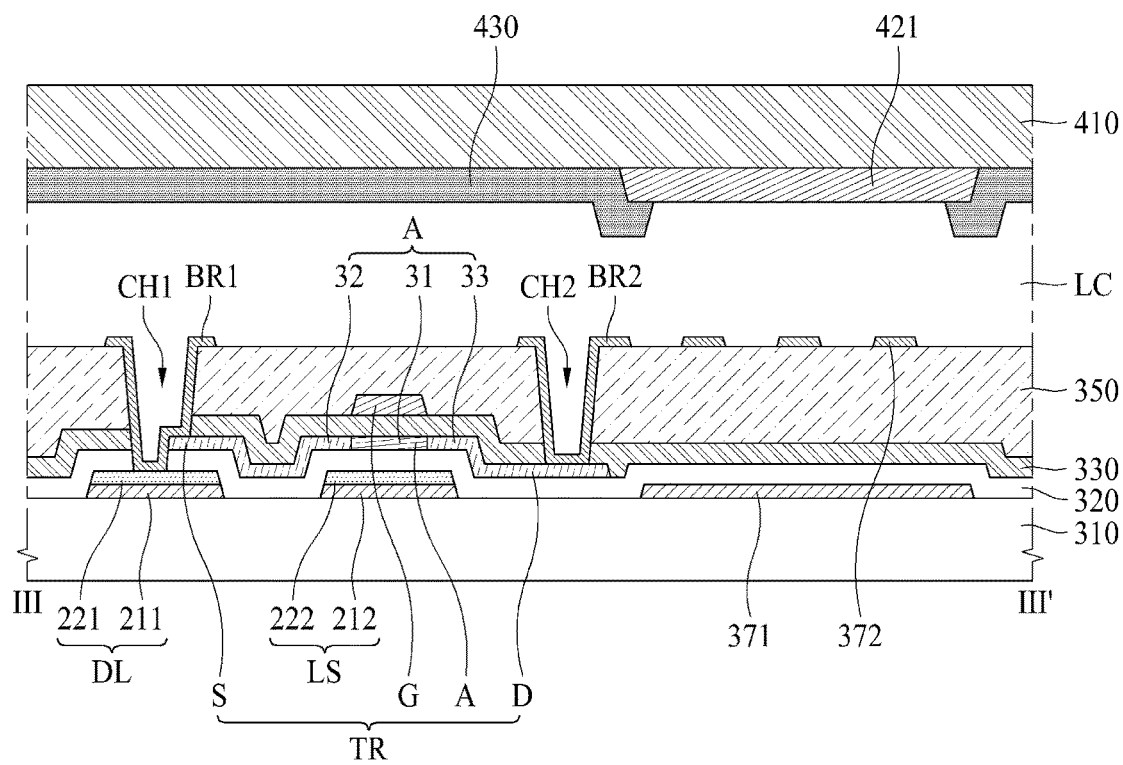
FIG. 9 is a cross sectional view along III-III' of FIG. 8 according to one embodiment of the present disclosure.

FIG. 8 is a plan view illustrating a pixel of a display apparatus 400 according to another embodiment of the present disclosure. FIG. 9 is a cross sectional view along III-III' of FIG. 8 according to one embodiment of the present disclosure.

Referring to FIGS. 8 and 9, a first electrode 371, which is disposed on the same layer as those of a light shielding layer (LS) and a data line (DL), functions as a common electrode, and a second electrode 372, which is disposed on the protection layer 350, functions as a pixel electrode. According to another embodiment of the present disclosure, the first electrode 371 may serve as the common electrode, and the second electrode 372 may serve as the pixel electrode.

In FIGS. 8 and 9, the second electrode 372 serving as the pixel electrode is connected with an active layer (A), and the first electrode 371 serving as the common electrode is not connected with the active layer (A).

Hereinafter, a method for manufacturing the display apparatus 100 according to one embodiment of the present disclosure will be described with reference to FIGS. 10A to 10J.

FIGS. 10A to 10J are cross sectional views illustrating a method for manufacturing the display apparatus 100 according to one embodiment of the present disclosure.

Figure 10A:
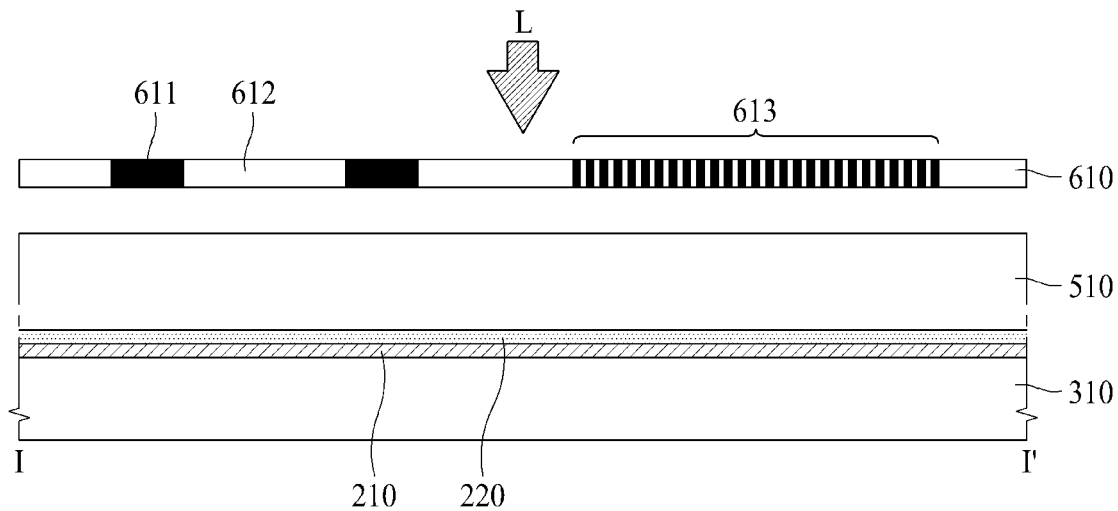
FIGS. 10A to 10J are cross sectional views illustrating a method for manufacturing the display apparatus according to one embodiment of the present disclosure.

Referring to FIG. 10A, a first conductive material layer 210 and a second conductive material layer 220 are provided on the substrate 310. The second conductive material layer 220 is provided on the first conductive material layer 210.

The first conductive material layer 210 is formed of a transparent conductive oxide (TCO), for example, ITO (InSnO), IZO(InZnO), IZTO(InZnSnO), ZO(ZnO), and etc. According to one embodiment of the present disclosure, the first conductive material layer 210 may be formed of ITO (InSnO).

The second conductive material layer 220 is formed of a material whose resistivity is lower than that of the first conductive material layer 210. Thus, the second conductive layer 221 has an electrical conductivity which is greater than that of the first conductive layer 211.

The second conductive material layer 220 may be formed of metal or metal alloy. For example, the second conductive material layer 220 may include at least one among molybdenum (Mo), aluminum (Al), chrome (Cr), aurum (Au), titanium (Ti), nickel (Ni), neodymium (Nd), copper (Cu), and their alloys. The second conductive material layer 220 may be formed in a single-layered structure comprising the above metal or metal alloys, or may be formed in a multi-layered structure comprising at least two of the above metal or metal alloys.

According to one embodiment of the present disclosure, the first conductive material layer 210 and the second conductive material layer 220 are patterned by an etching process using a halftone mask 610, to thereby form the light shielding layer (LS), the data line (DL) corresponding to the signal line, and the first electrode 371. In FIGS. 10A to 10J, for convenience of explanation, a method for manufacturing the display apparatus 100 will be described with reference to the embodiment using the data line (DL) as the signal line.

In FIGS. 10A to 10F, an etching process using a halftone mask 610 is shown by each step.

Referring to FIG. 10A, a photoresist layer 510 is disposed on the second conductive material layer 220, and the halftone mask 610 is disposed above the photoresist layer 510.

The halftone mask 610 is disposed while being spaced apart from the photoresist layer 510, and light is irradiated thereonto through the halftone mask 610, whereby a selective exposure for the photoresist layer 510 is performed.

Referring to FIG. 10A, the halftone mask 610 comprises a light blocking portion 611, a transmitting portion 612, and a semi-transmitting portion 613.

By the exposure using the halftone mask 610, the photoresist layer 510 is selectively exposed.

Figure 10B:
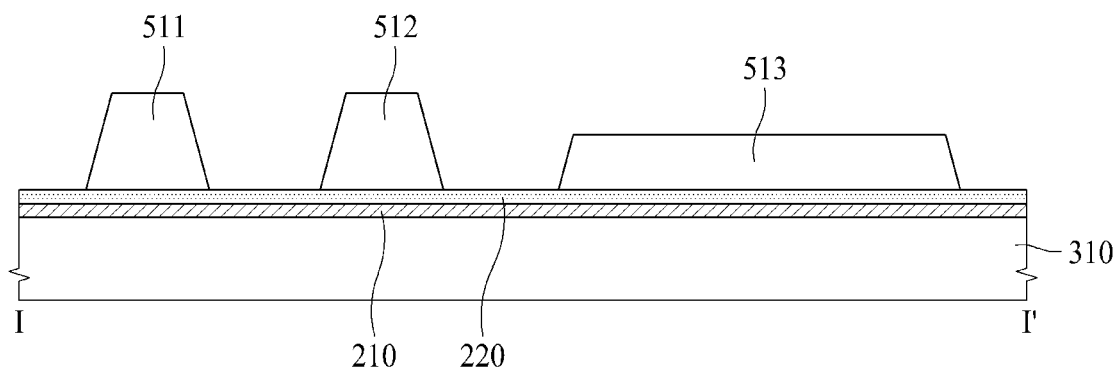

Referring to FIG. 10B, the selectively-exposed photoresist layer 510 is developed, to thereby form a plurality of photoresist patterns 511, 512, and 513.

Figure 10C:
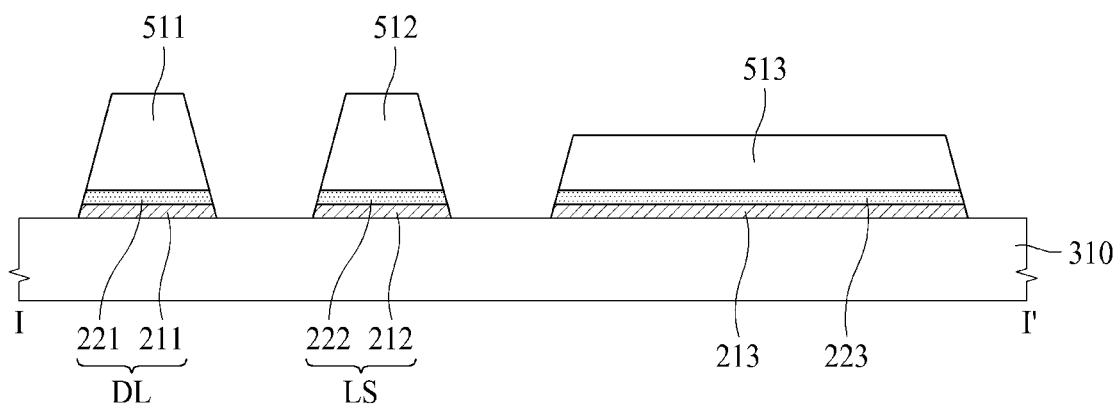

Referring to FIG. 10C, the first conductive material layer 210 and the second conductive material layer 220 are patterned by an etching process using the photoresist pattern 511, 512, and 513 as a mask, to thereby form the data line (DL) and the light shielding layer (LS).

The data line (DL) corresponding to the signal line includes the first conductive layer 211 formed by patterning the first conductive material layer 210, and the second conductive layer 221 formed by patterning the second conductive material layer 220.

The light shielding layer (LS) and the data line (DL) may be manufactured by the same process using the same material. Thus, the light shielding layer (LS) and the data line (DL) may have the same lamination structure. The light shielding layer (LS) includes the first conductive layer 212 formed by patterning the first conductive material layer 210, and the second conductive layer 222 formed by patterning the second conductive material layer 220.

A resistivity of the second conductive layer 221 and 222 is lower than a resistivity of the first conductive layer 211 and 212. Thus, an electrical conductivity of the second conductive layer 221 and 222 is relatively greater than an electrical conductivity of the first conductive layer 211 and 212.

At the forming the position of the first electrode 371, a first conductive layer 213 is formed by patterning the first conductive material layer 210, and a second conductive layer 223 is formed by patterning the second conductive material layer 220.

Figure 10D:
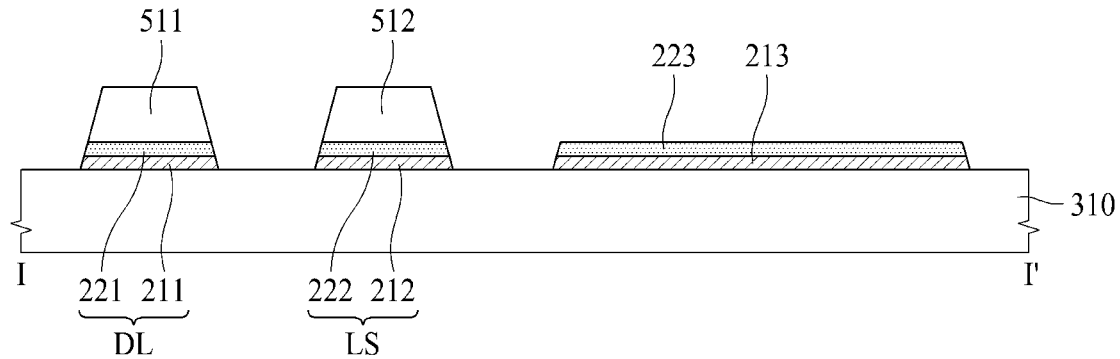

Referring to FIG. 10D, the photoresist pattern 513 is removed from the forming position of the first electrode 371 by additionally ashing the photoresist patterns 511, 512 and 513. As a result, at the forming position of the first electrode 371, an upper surface of the second conductive material layer 223 is exposed from the photoresist pattern 513.

Figure 10E:
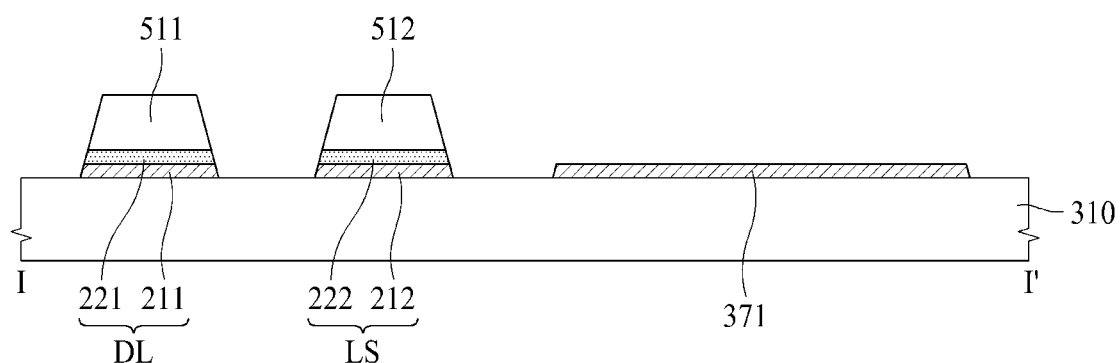

Referring to FIG. 10E, the second conductive layer 223 which remains in the forming position of the first electrode 371 is removed by an etching process using the remaining photoresist pattern 511 and 512 as a mask. Accordingly, the first conductive layer 213 which is formed by patterning the first conductive material layer 210 becomes the first electrode 371.

According to one embodiment of the present disclosure, the second conductive material layer 220 provided on the first conductive material layer 210 is removed from the forming position of the first electrode 371.

Figure 10F:
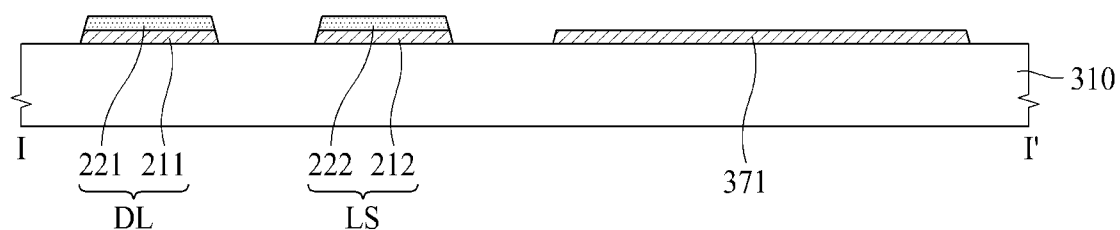

Referring to FIG. 10F, the data line (DL), the light shielding layer (LS), and the first electrode 371 are completed by removing the remaining photoresist pattern 511 and 512.

Figure 10G:
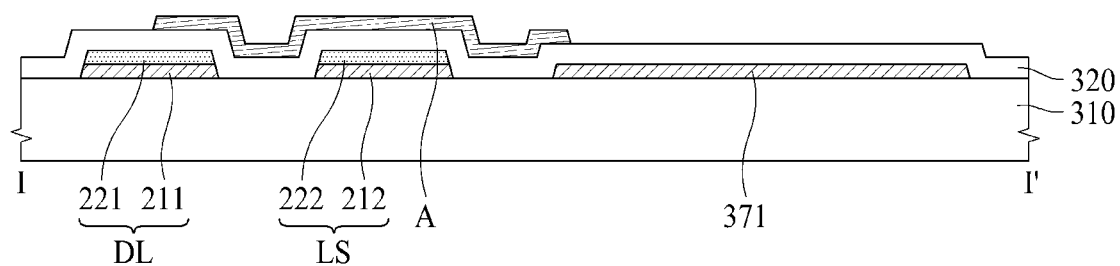

Referring to FIG. 10G, the buffer layer 320 is disposed on the light shielding layer (LS), the data line (DL), and the first electrode 371, and the active layer (A) is disposed on the buffer layer 320. The active layer (A) includes the oxide semiconductor material. A mask process for forming the active layer (A) is carried out.

Figure 10H:
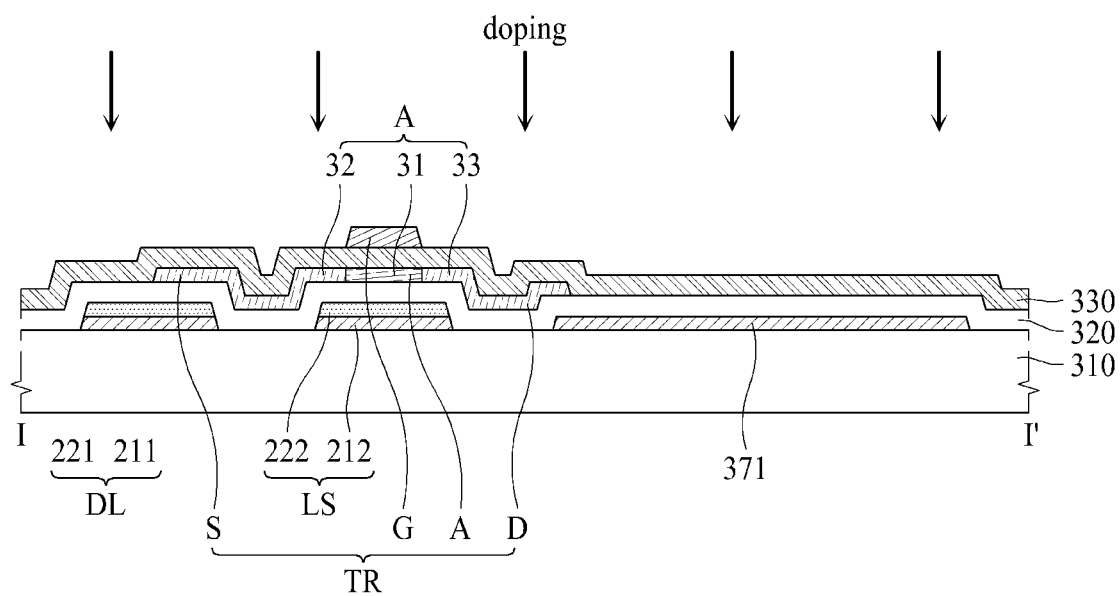

Referring to FIG. 10H, the gate insulating film 330 is provided on the active layer (A), and the gate electrode (G) is provided on the gate insulating film 330. At least some portions of the gate electrode (G) may be overlapped with the active layer (A).

The gate insulating film 330 is disposed on the entire upper surface of the substrate 310 including the upper surface of the active layer (A). The gate insulating film 330 is not patterned.

A mask process for forming the gate electrode (G) is carried out.

Referring to FIG. 10H, some portions of the active layer (A) selectively become the conducting regions by a doping process using the gate electrode (G) as a mask. A portion of the active layer (A), which is overlapped with the gate electrode (G), is not provided with conductivity, and thus does not become the conducting region, but become the channel region 31. Some portions of the active layer (A), which are not overlapped with the gate electrode (G), are provided with conductivity, and thus become the conducting regions 32 and 33.

Figure 10I:
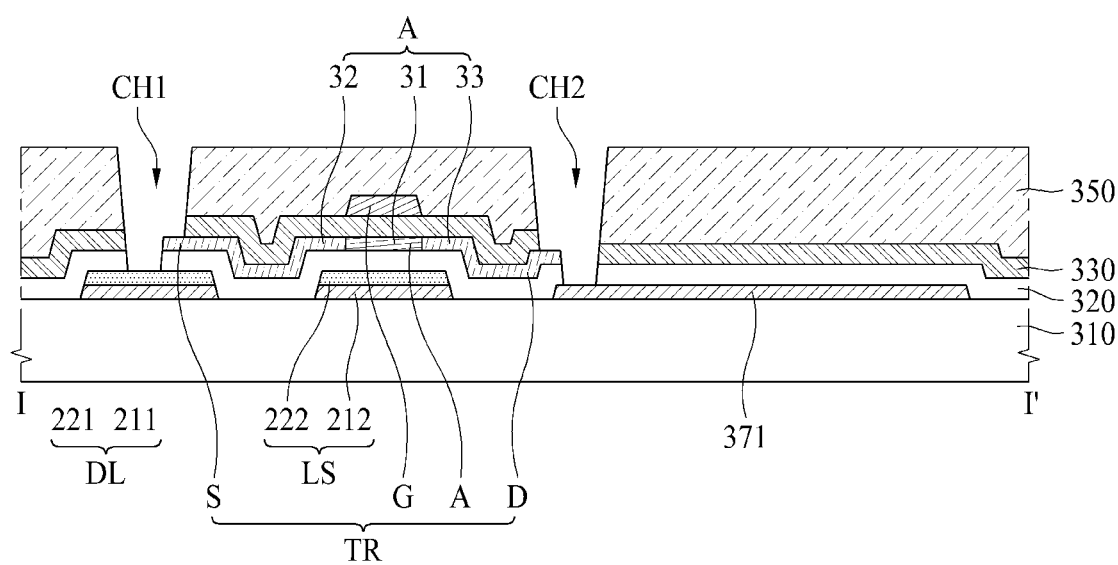

Referring to FIG. 10I, the protection layer 350 is provided on the gate electrode (G). The contact hole (CH1, CH2) is formed in the protection layer 350. The contact hole (CH1, CH2) penetrates through the protection layer 350, and also penetrates through the gate insulating film 330 and the buffer layer 320.

A mask process for forming the contact hole (CH1, CH2) is carried out.

According to one embodiment of the present disclosure, a process for forming the additional source and drain electrodes is omitted. Thus, according to one embodiment of the present disclosure, it is possible to omit at least one mask process for forming the source and drain electrodes. As a result, it is possible to simplify a process for manufacturing the display apparatus 100.

Figure 10J:
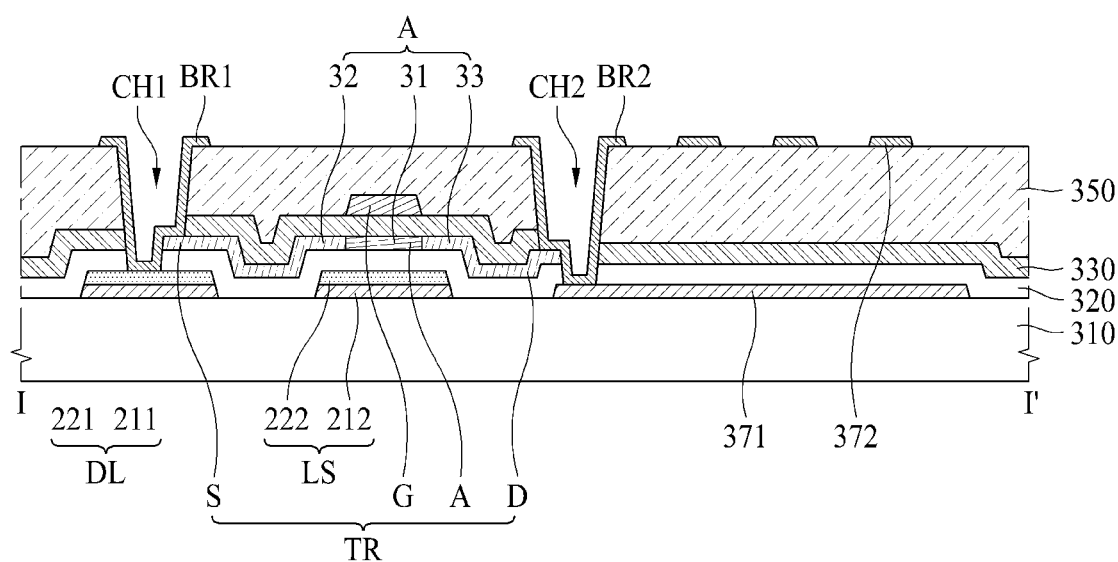

Referring to FIG. 10J, the second electrode 372, the first connection electrode (BR1), and the second connection electrode (BR2) are provided.

The second electrode 372 is provided on the protection layer 350.

The first connection electrode (BR1) connects the active layer (A) with the data line (DL).

The second connection electrode (BR2) connects the active layer (A) with any one of the first electrode 371 and the second electrode 372. In FIG. 10J, it shows that the second connection electrode (BR2) connects the first electrode 371 with the active layer (A).

FIG. 10J shows that the first connection electrode (BR1) and the second connection electrode (BR2) are provided on the protection layer 350, but not limited to this structure. The first connection electrode (BR1) and the second connection electrode (BR2) may not extend to the upper surface of the protection layer 350, that is, the first connection electrode (BR1) and the second connection electrode (BR2) may be disposed only inside the first contact hole and the second contact hole, respectively.

According to one embodiment of the present disclosure, the first connection electrode (BR1), the second connection electrode (BR2), and the second electrode 372 may be manufactured at the same time by the same process using the same material.

A mask process for forming the first connection electrode (BR1), the second connection electrode (BR2), and the second electrode 372 is carried out.

Then, the confronting substrate 410 is provided to confront the substrate 310, and the liquid crystal layer (LC) is disposed between the substrate 310 and the confronting substrate 410 (See FIG. 4). The liquid crystal layer (LC) is disposed on the second electrode 372.

In the display apparatus according to one embodiment of the present disclosure, the first electrode of the display device, the light shielding layer, and the signal line are disposed on the same layer, and are manufactured by the same mask process. Thus, it is possible to omit an additional mask process for forming the light shielding layer, and a mask process for forming the first electrode of the display device.

In addition, according to one embodiment of the present disclosure, the signal line and the active layer of the thin film transistor may be connected by the use of connection electrode formed by the process for forming the second electrode of the display device. Thus, in the manufacturing process of the display apparatus, it is possible to omit an additional mask process for forming the source and drain electrodes of the thin film transistor.

According to the embodiments of the present disclosure, the lamination structure of the display apparatus is simplified so that it is possible to simplify the manufacturing process of the display apparatus. As a result, it is possible to lower a manufacturing cost of the display apparatus, and to decrease manufacturing defects, to thereby improve the yield.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display apparatus comprising:
    a substrate;
    a light shielding layer, a signal line, and a first electrode on the substrate such that the light shielding layer, the signal line, and the first electrode are on a same plane;
    an active layer on the light shielding layer, the signal line, and the first electrode, the active layer including a first conducting region, a second conducting region, and a channel region between the first conducting region and the second conducting region;
    a gate electrode on the active layer, the gate electrode being partially overlapped with the active layer;
    a second electrode on the first electrode;
    a first connection electrode directly connected to a lateral surface of the first conducting region of the active layer, the first connection electrode configured to electrically connect the active layer with the signal line; and
    a second connection electrode directly connected to a lateral surface of the second conducting region of the active layer and connected to the first electrode that is in the same plane as the light shielding layer and the signal line, the second connection electrode configured to electrically connect the active layer with the first electrode,
    wherein any one of the first electrode and the second electrode is a pixel electrode of a display device, and the other is a common electrode of the display device, the light shielding layer, the signal line, and the first electrode are disposed on a same layer, and the first electrode is formed of a transparent conductive oxide (TCO), and the first connection electrode and the second connection electrode are formed of a same material as that of the second electrode.

2. The display apparatus according to claim 1, wherein the signal line includes:
a first conductive layer formed of a same material as that of the first electrode; and
a second conductive layer on the first conductive layer, wherein a resistivity of the second conductive layer is lower than a resistivity of the first conductive layer.

3. The display apparatus according to claim 2, wherein the first conductive layer is formed of a transparent conductive oxide (TCO), and the second conductive layer is formed of metal or metal alloy.

4. The display apparatus according to claim 2, wherein the light shielding layer has a lamination structure which is the same as that of the signal line.

5. The display apparatus according to claim 1, wherein the signal line is a data line.

6. The display apparatus according to claim 1, wherein the light shielding layer is connected with the gate electrode.

7. The display apparatus according to claim 1, further comprising a gate insulating film disposed between the active layer and the gate electrode, and provided on an entire upper surface of the substrate including an upper surface of the active layer.

8. The display apparatus according to claim 1, wherein the active layer is disposed between the gate electrode and the substrate.

9. The display apparatus according to claim 1, wherein the active layer includes an oxide semiconductor material.

10. The display apparatus according to claim 1, wherein the active layer includes:
a first oxide semiconductor layer on a buffer layer; and
a second oxide semiconductor layer on the first oxide semiconductor layer.

11. The display apparatus according to claim 10, wherein the active layer has a tapered shape.

12. The display apparatus according to claim 1, wherein the first connection electrode and the second connection electrode are disposed on a same layer as that of the second electrode.

13. The display apparatus according to claim 1, further comprising a liquid crystal layer disposed on the second electrode.

14. A method for manufacturing a display apparatus comprising:
forming a first conductive material layer of a transparent conductive oxide (TCO) on a substrate, and forming a second conductive material layer on the first conductive material layer, wherein a resistivity of the second conductive material layer is lower than a resistivity of the first conductive material layer;
forming a light shielding layer, a signal line, and a first electrode by patterning the first conductive material layer and the second conductive material layer by the use of etching process using a halftone mask, such that the light shielding layer, the signal line, and the first electrode are on a same plane;
forming an active layer on the light shielding layer, the signal line, and the first electrode, the active layer including a first conducting region, a second conducting region, and a channel region between the first conducting region and the second conducting region;
forming a gate electrode on the active layer, the gate electrode being partially overlapped with the active layer;
selectively providing conductivity to the active layer to selectively make conducting regions in the active layer under the condition that the gate electrode is used as a mask; and
forming a first connection electrode that is directly connected to a lateral surface of the first conducting region of the active layer, the first connection electrode configured to electrically connect the active layer with the signal line, and forming a second connection electrode that is directly connected to a lateral surface of the second conducting region of the active layer and connected to the first electrode that is in the same plane as the light shielding layer and the signal line, the second connection electrode configured to electrically connect the active layer with the first electrode,
wherein any one of the first electrode and the second electrode is a pixel electrode of a display device, and the other is a common electrode of the display device, and
the first electrode is formed of the transparent conductive oxide (TCO) and does not have the second conductive material layer.

15. The method according to claim 14, wherein the first connection electrode, the second connection electrode, and the second electrode are manufactured by a same process using the same material.

16. The method according to claim 14, wherein the signal line includes:
a first conductive layer formed by patterning the first conductive material layer; and
a second conductive layer formed by patterning the second conductive material layer.

17. The method according to claim 16, wherein the light shielding layer has a lamination structure which is the same as that of the signal line.

18. The method according to claim 14, wherein the second conductive material layer on the first conductive material layer is removed in the forming of the first electrode.

19. The method according to claim 14, wherein the step of selectively making the conducting regions in the active layer is performed by a doping process.

20. The display apparatus of claim 1, wherein the second connection electrode is disposed on at least some portions of a sidewall and a bottom of a contact hole.

21. The display apparatus of claim 20, wherein a portion of the second connection electrode is in contact with the first electrode and an end of the second connection electrode is in a same layer as the second electrode.

22. The display apparatus of claim 20, wherein a portion of the second connection electrode is in contact with the second conducting region of the active layer and an end of the second connection electrode is in a same layer as the second electrode.

23. The display apparatus of claim 1, wherein the second electrode is on the first electrode such that the second electrode is farther from the substrate than the first electrode, and the first connection electrode has a first end that is on a same layer as the second electrode and a second end that is directly connected to the end of the first conducting region of the active layer.

* * * * *